(12) United States Patent
Yoon et al.

(10) Patent No.: US 6,327,214 B1
(45) Date of Patent: Dec. 4, 2001

(54) MULTI-BANK MEMORY DEVICE HAVING INPUT AND OUTPUT AMPLIFIER SHARED BY ADJACENT MEMORY BANKS

(75) Inventors: Hong-il Yoon, Seoul; Chang-ho Lee, Kyungki-do, both of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/449,110

(22) Filed: Nov. 24, 1999

(30) Foreign Application Priority Data

Feb. 1, 1999 (KR) .................................................. 99-3222

(51) Int. Cl.[7] ........................................................ G11C 8/00
(52) U.S. Cl. ......................... 365/230.03; 365/51; 365/205
(58) Field of Search .................... 365/230.05, 51, 365/205, 207, 206, 189.01, 230.01

(56) References Cited

U.S. PATENT DOCUMENTS 5,594,704 * 1/1997 Konishi et al. ...................... 365/233
5,991,216 * 11/1999 Raad et al. ........................... 365/203
5,991,223 * 11/1999 Kozaru et al. ................... 365/230.03

* cited by examiner

*Primary Examiner*—Hoai V. Ho
(74) *Attorney, Agent, or Firm*—Skjerven Morrill MacPherson LLP

(57) ABSTRACT

A memory device includes multiple memory banks that share an IO sense amplifier so that the number of sense amplifiers and the number of data lines coupled to the sense amplifiers is decreased and the area of a chip is reduced. In one embodiment, the memory device includes a plurality of memory banks, a plurality of global IO lines in the memory banks for transmitting data from the memory banks, and a plurality of IO sense amplifiers. Each sense amplifier is shared by at least two adjacent memory banks, for selectively sensing and amplifying data received from the global IO lines.

3 Claims, 4 Drawing Sheets

MULTI-BANK MEMORY DEVICE HAVING INPUT AND OUTPUT AMPLIFIER SHARED BY ADJACENT MEMORY BANKS

BACKGROUND OF THE INVENTION

1. Field of the Invention

The present invention relates to a semiconductor memory device, and more particularly, to a semiconductor memory device having sense amplifiers shared by adjacent memory banks.

2. Description of the Related Art

To take full advantage of an improvement in the operational speed of a central processing unit (CPU), the performance of a memory device storing information such as data and programs for the CPU should be correspondingly improved. However, the operational speeds of CPUs have improved so remarkably that the CPUs usually outperform conventional DRAMs, and the operational speed of the DRAM is often slower than the operational speed of the CPU. Multi-bank synchronous DRAMs, which include multiple banks and operate in synchronization with a system clock signal, have been developed to provide higher performance and overcome this problem.

Additionally, recent developments in multimedia applications have increasingly demanded semiconductor memory devices having large bandwidths, i.e., the capability to transmit a large amount of IO data per unit time. Accordingly, semiconductor memory devices having high bandwidths with 16, 32, 64, or more parallel bits have been developed. However, memory devices having a high bandwidth require many data lines for transmitting data. In particular, a double data rate synchronous DRAM, which outputs twice the amount of data per clock cycle, normally requires twice as many data lines. The increase in the number of data lines directly increases the area of a DRAM chip. Since the enlargement of the chip area increases the manufacturing cost, efficient data line use and layout are sought to reduce the chip area of a semiconductor memory device.

SUMMARY OF THE INVENTION

In accordance with an aspect of the present invention, an integrated circuit memory device such as a DRAM has fewer data lines. This reduces the chip area of the memory device.

According to one embodiment of the invention, a memory device such as a DRAM includes a plurality of memory banks, a plurality of global IO lines, and a plurality of IO sense amplifiers. The global IO lines are in the memory banks and transmit data read from the memory banks. The global IO lines from at least two of the memory banks connect to the same sense amplifier so that at least two memory banks share each IO sense amplifier, for selectively sensing and amplifying data received from the global IO lines.

Preferably, each of the IO sense amplifiers includes a plurality of IO sense amplifying units and a plurality of switches. The switches connect selected global IO lines in a memory bank to the corresponding IO sense amplifying units in response to activation of bank selection signals. Each of the plurality of switches typically includes transfer gates that bank selection signals turn on or off.

Each of the plurality of IO sense amplifiers can be shared by two adjacent memory banks or four adjacent memory banks. When four adjacent memory banks share one sense amplifier, two of the four memory banks are preferably on the left and right sides of one column decoder to share the column decoder. The bank selection signals determine which one of the memory banks uses the column decoder during a particular data access.

According to an aspect of the present invention, at least two adjacent memory banks share a sense amplifier, so that the number of sense amplifiers and the number of data lines are reduced. Consequently, the area of a chip is reduced.

BRIEF DESCRIPTION OF THE DRAWINGS

The aspects and advantages of the present invention will become more apparent by describing exemplary embodiments thereof with reference to the attached drawings in which.

DESCRIPTION OF THE PREFERRED EMBODIMENTS

Figure 1:
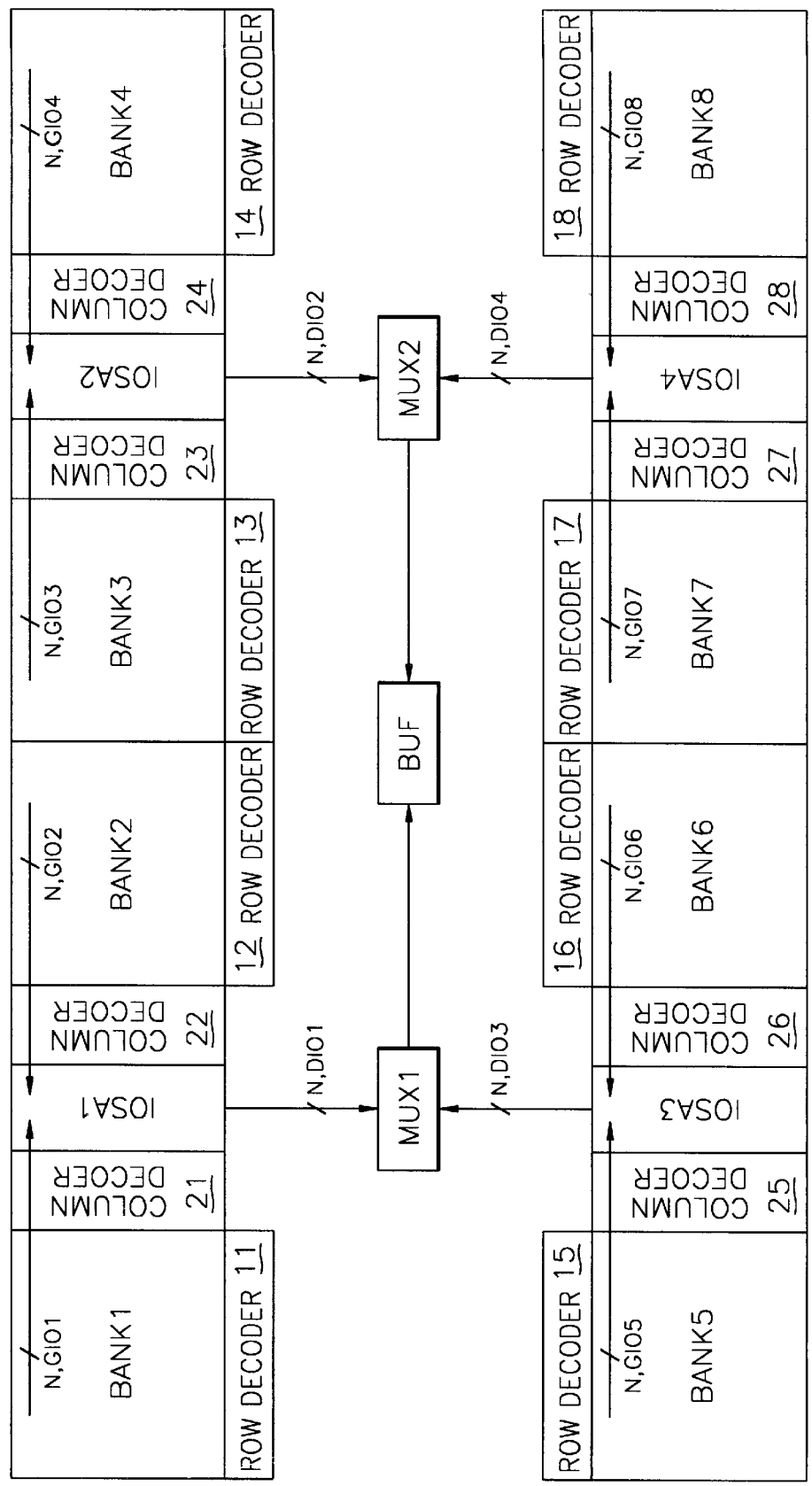
FIG. 1 is a block diagram illustrating the configuration of a multi-bank memory device according to an embodiment of the present invention.

The attached drawings illustrate exemplary embodiments of the present invention. Hereinafter, the present invention will be described by explaining the exemplary embodiments of the present invention with reference to the attached drawings. Like reference symbols in the drawings denote the same or similar elements.

FIG. 1 is a block diagram illustrating the configuration of a multi-bank memory device according to an embodiment of the present invention. In FIG. 1, a double data rate synchronous DRAM includes eight memory banks BANK1 to BANK8 as an example. Alternative embodiments of the invention might include any number of memory banks. In addition to memory banks BANK1 through BANK8, the memory device includes input and output (IO) sense amplifiers IOSA1 through IOSA4, row decoders 11 through 18, column decoders 21 through 28, data input and output multiplexers MUX1 and MUX2, and a data input and output (IO) buffer BUF.

The first through eighth memory banks BANK1 through BANK8 include first through eighth global input and output (IO) buses GIO1 through GIO8, row decoders 11 through 18, and column decoders 21 through 28, respectively. Pairs of memory banks BANK1/BANK2, BANK3/BANK4, BANK5/BANK6, and BANK7/BANK8 respectively share IO sense amplifiers IOSA1, IOSA2, IOSA3, and IOSA4 and have respective global IO buses coupled to the shared sense amplifier. In particular, global IO buses GIO1 and GIO2 connect to the sense amplifier IOSA1 for memory banks BANK1 and BANK2. Global IO buses GIO3 and GIO4 connect to the sense amplifier IOSA2 for memory banks BANK3 and BANK4. Global IO buses GIO5 and GIO6 connect to sense amplifier IOSA3, and global IO buses GIO7 and GIO8 connect to sense amplifier IOSA4. Each of IO sense amplifiers IOSA1 through IOSA4 selectively senses and amplifies data transmitted on global IO buses GIO1 through GIO8. For example, the first IO sense amplifier IOSA1 selectively senses and amplifies data transmitted to the first or second global IO bus GIO1 or GIO2. The data IO multiplexers MUX1 and MUX2 receive the sensed and amplified data via data IO buses DIO1 through DIO4 and transmit the data to the data IO buffer BUF.

When each of the first through eighth global IO buses GIO1 through GIO8 has N lines, each of the first through fourth data IO buses DIO1 through DIO4 also has N lines. (Typically, two lines that carry complementary signals transmit each data bit, and N is an integer value equal to twice number of bits that can be read in parallel from a memory bank.) In the conventional memory, each of the memory banks includes an IO sense amplifier that connects to a separate data IO bus. Since each IO sense amplifier connects to N data IO lines, the two IO sense amplifiers in the two adjacent memory banks connect to 2N data IO lines. However, when two adjacent memory banks share an IO sense amplifier as in the embodiment of FIG. 1, the two memory banks have only one IO sense amplifier and one set of data IO buses. Thus, the total number of data IO lines for two banks is N, which is half the number required when banks do not share the IO sense amplifiers.

Figure 2:
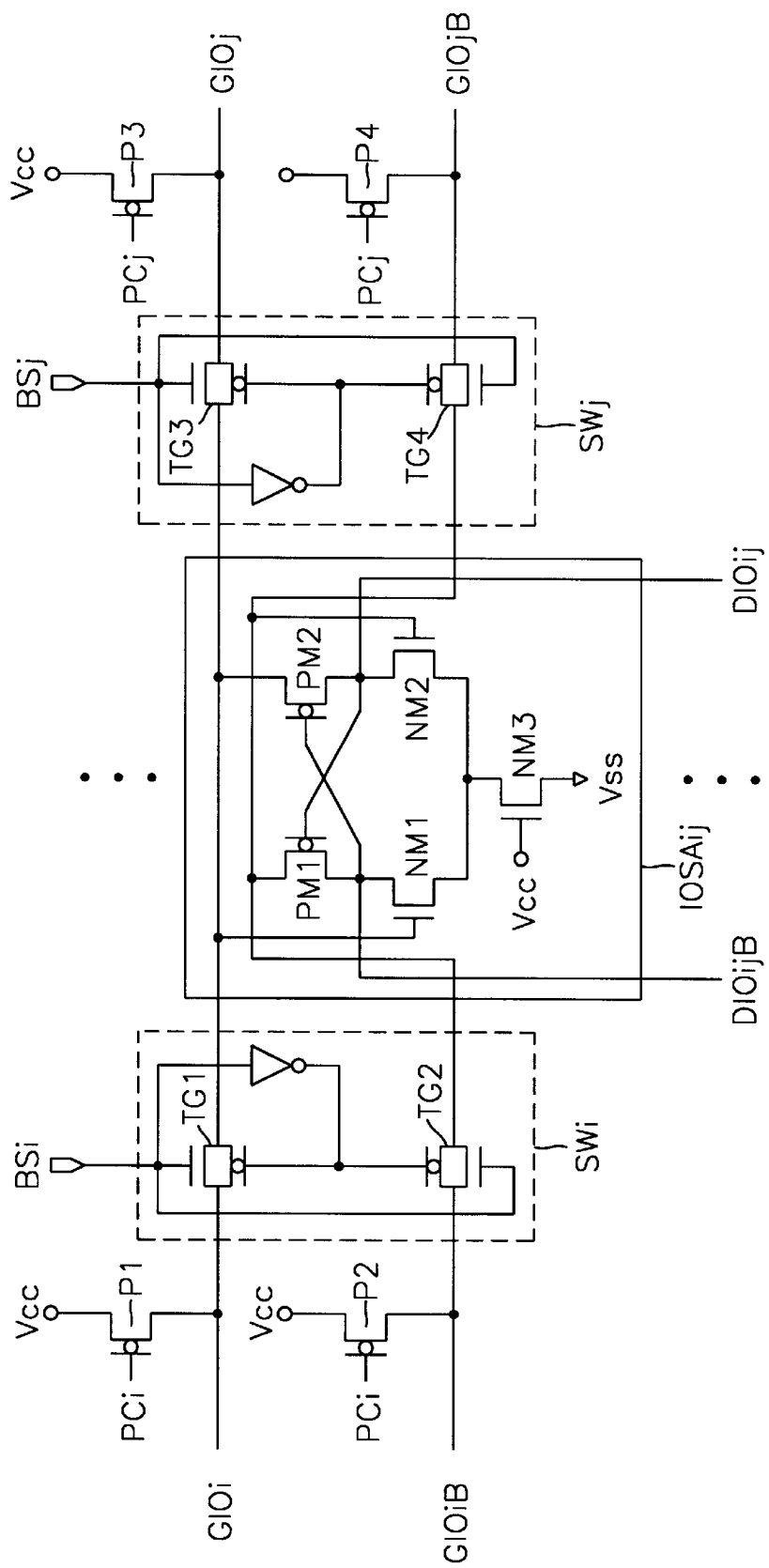
FIG. 2 is a circuit diagram of a portion of a sense amplifier in the memory device of FIG. 1.

FIG. 2 is a circuit diagram of a portion of an IO sense amplifier IOSA1, IOSA2, IOSA3 or IOSA4 of FIG. 1. In particular, FIG. 2 illustrates an IO sense amplifying unit IOSAij associated with a global IO line GIOi in the i-th memory bank and a global IO line GIOj in the j-th memory bank. Each of the first through fourth IO sense amplifiers IOSA1 through IOSA4 has essentially the same configuration and includes multiple IO sense amplifying units identical to sense amplifying unit IOSAij and multiple pairs of switches identical to switches SWi and SWj of FIG. 2. The number of sense amplifying units in a sense amplifier IOSA1, IOSA2, IOSA3, or IOSA4 is equal the number of bits that can be read in parallel from a memory bank.

Each of the IO sense amplifying units IOSAij senses and amplifies a data bit transmitted on global IO lines GIOi and GIOj, and can be embodied as a PMOS cross-coupled amplifier, which is known to operate at high speed and consume a small amount of power. According to an exemplary embodiment, each of the IO sense amplifying units IOSAij includes two PMOS transistors PM1 and PM2 and three NMOS transistors NM1, NM2 and NM3 connected as shown in FIG. 2. Load transistors P1 through P4 precharge global IO lines GIOi, GIOiB, GIOj, and GIOjB for sensing in response to a precharge signal PCi or PCj for the i-th or j-th memory bank. Such IO sense amplifying units IOSAij can be easily realized by those skilled in the art.

Each of the switches SWi and SWj corresponds to a pair of complementary global IO lines. The activation of a bank selection signal BSi or BSj activates switch SWi or SWj to connect the corresponding pair of global IO lines GIOi and GIOiB or GIOj and GIOjB to IO sense amplifying unit IOSAij. In particular, switch SWi connects the global IO lines GIOi and GIOiB to IO sense amplifying unit IOSAij in response to bank selection signal BSi, and switch SWj connects the global IO lines GIOj and GIOjB to the IO sense amplifying unit IOSAij in response to bank selection signal BSj. As shown in FIG. 2, the switches SWi and SWj can be realized with transfer gates TG1, TG2, TG3 and TG4, which are controlled by the bank selection signals BSi and BSj.

When the i-th memory bank is selected, the bank selection signal BSi is activated, enabling the switch SWi for the global IO line GIOi. Accordingly, switch SWi connects the global IO lines GIOi and GIOiB to the IO sense amplifying unit IOSAij. As a consequence, the IO sense amplifying unit IOSAij senses a data bit transmitted on the global IO line GIOi and transmits the data bit to corresponding data lines DIOij and DIOijB.

According to the embodiment of FIG. 1, two adjacent memory banks share one IO sense amplifier. Thus, when one of two adjacent memory banks, e.g., memory bank BANK1 or BANK2, is selected, data transmitted on global IO bus GIO1 or GIO2 in the memory bank BANK1 or BANK2 is selectively sensed and amplified by the IO sense amplifier IOSA1. Consequently, the memory device requires half as many sense amplifiers as memory banks, and the number of data IO lines DIO1, DIO2, DIO3 and DIO4 connected to the IO sense amplifiers is halved. Hence, having two memory banks share one IO sense amplifier improves the efficiency of the layout of the memory device.

Figure 3:
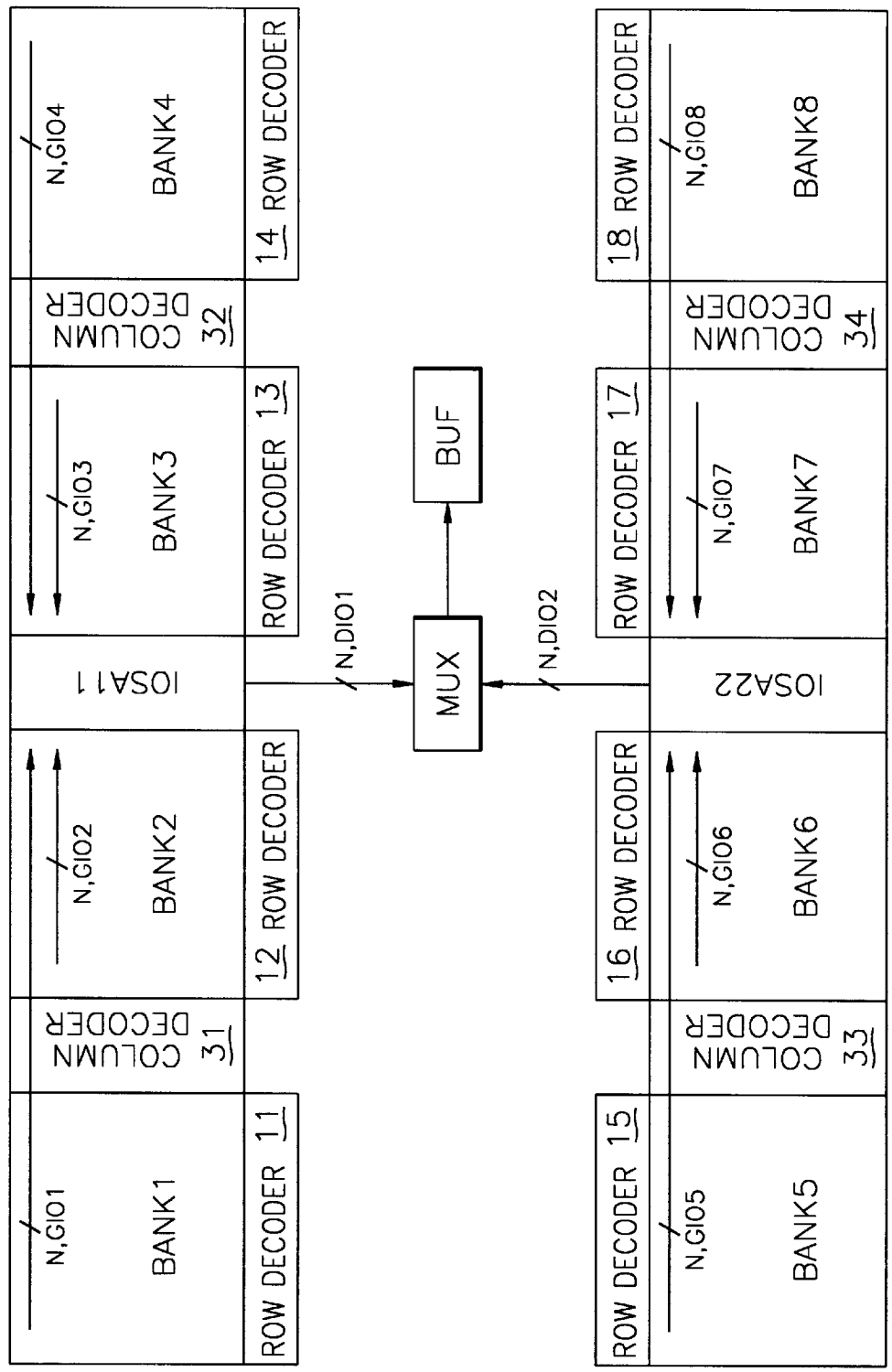
FIG. 3 is a block diagram illustrating the configuration of a multi-bank memory device according to another embodiment of the present invention.

FIG. 3 is a block diagram illustrating the configuration of a multi-bank memory device according to another embodiment of the present invention. The multi-bank memory device according to this embodiment is the same as that of the embodiment of FIG. 1 except that four memory banks share one IO sense amplifier and two adjacent memory banks share a column decoder. A double data rate synchronous DRAM including eight memory banks is described as an example similar to the above embodiment.

The memory device of FIG. 3 includes first through eighth memory banks BANK1 through BANK8, first and second IO sense amplifiers IOSA11 and IOSA22, row decoders 11 through 18, column decoders 31 through 34, a data IO multiplexer MUX, and a data IO buffer BUF. The memory banks BANK1 through BANK8 respectively include the global IO buses GIO1 through GIO8 and the row decoders 11 through 18. Each of column decoders 31 through 34 is between and shared by two adjacent memory banks. For example, the memory banks BANK1 and BANK2 share the column decoder 31, which is interposed between the memory banks BANK1 and BANK2. Preferably, the memory banks BANK1 and BANK2 are on the left and right sides of the column decoder 31, respectively, as shown in FIG. 3.

Four adjacent memory banks BANK1 through BANK4 share the IO sense amplifier IOSA11, and four adjacent memory banks BANK5 through BANK8 share the IO sense amplifier IOSA22. The IO sense amplifiers IOSA11 and IOSA22 selectively sense and amplify data transmitted on corresponding global IO buses GIO1 through GIO8. The data IO multiplexer MUX receives the sensed and amplified data via the first and second data IO buses DIO1 and DIO2 and transmits the sensed and amplified data to the data IO buffer BUF.

When each of the global IO buses GIO1 through GIO8 includes N lines, each of the data IO buses DIO1 and DIO2 also includes N lines, and the number of data IO lines in buses DIO1 and DIO2 is one quarter of the number of data lines in the conventional case where each memory bank includes an IO sense amplifier. In the conventional case where each of the memory banks includes an IO sense amplifier, eight memory banks include eight IO sense amplifiers, and the eight IO sense amplifiers connect to 8N data IO lines. However, when four memory banks share an IO sense amplifier as in the embodiment of FIG. 3, the eight memory banks have only two IO sense amplifiers IOSA11 and IOSA22 and two sets of IO data buses DIO1 and DIO2. Since each set of the data IO buses DIO1 and DIO2 has N lines, the number of IO data lines is 2N or one quarter of the number required in the case where IO sense amplifiers are not shared.

Figure 4:
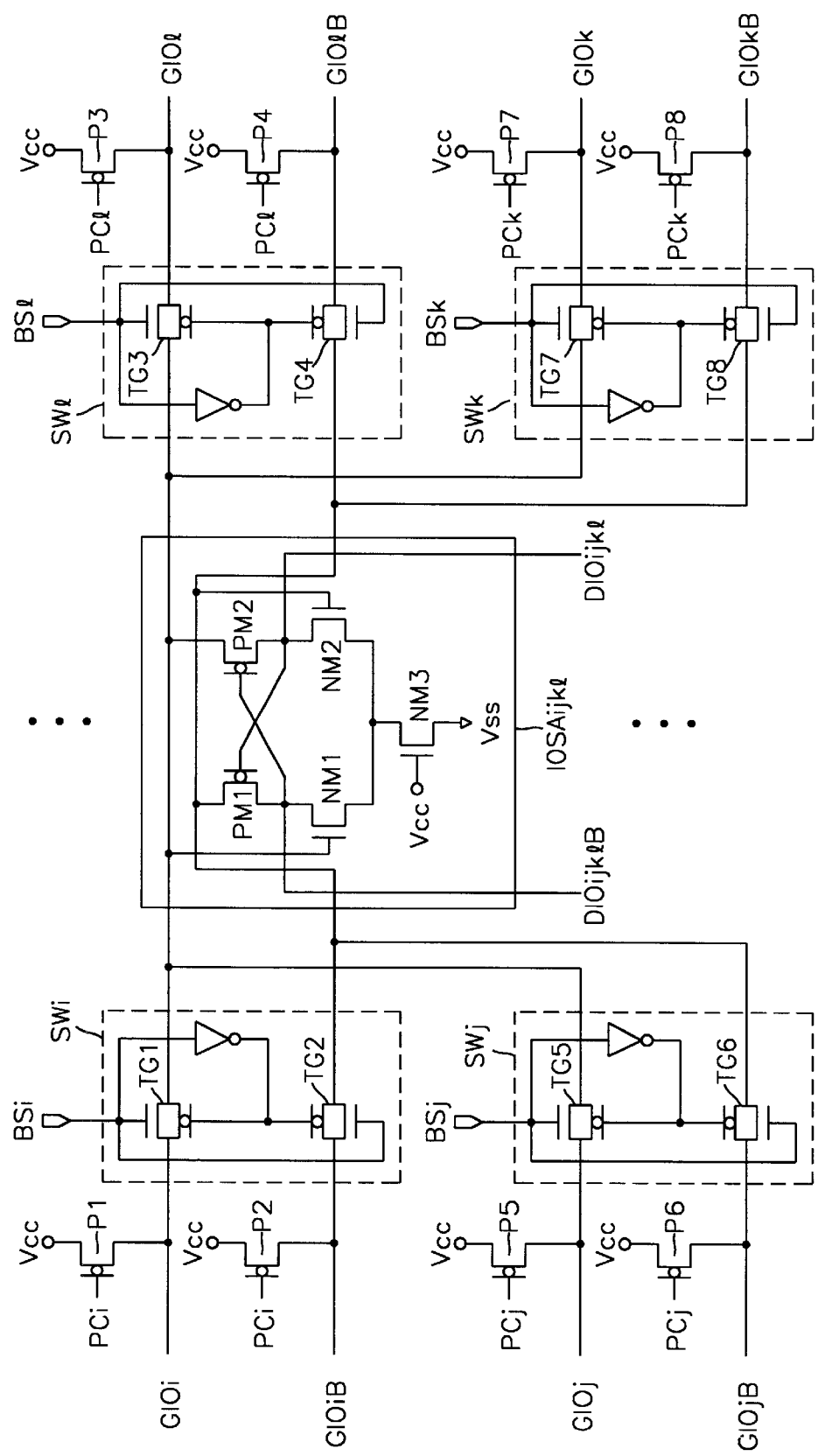
FIG. 4 is a circuit diagram of a portion of a sense amplifier in the memory device of FIG. 3.

FIG. 4 is a circuit diagram of a portion of one of the IO sense amplifiers IOSA11 and IOSA22 of FIG. 3. In FIG. 4, an IO sense amplifying unit IOSAijkl connects to global IO lines GIOi, GIOj, GIOk, and GIOl in the i-th, j-th, k-th and l-th memory bank. Thus, IO sense amplifying unit IOSAijkl connects to and is shared by four memory banks. Sense amplifying unit IOSAijkl is the same as sense amplifying unit IOSAij of FIG. 2. The IO sense amplifiers IOSA11 and IOSA22 are the same as the IO sense amplifiers IOSA1 through IOSA4 of FIG. 1 except that each sense amplifying unit IOSAijkl connects to four global IO lines GIOi, GIOj, GIOk, and GIOl through four switches SWi, SWj, SWk, and SWl. Load transistors P1 through P8 precharge respective global IO lines GIOi, GIOiB, GIOj, GIOjB, GIOk, GIOkB, GIOl, and GIOlB in response to corresponding precharge signals PCi, PCj, PCk, and PCl.

Each of the IO sense amplifiers IOSA11 and IOSA22 includes multiple IO sense amplifying units such as sense amplifying unit IOSAijkl and includes multiple sets of switches such as switches SWi, SWj, SWk, and SWl. Each of the IO sense amplifying units IOSAijkl senses and amplifies data transmitted on the global IO lines GIOi, GIOj, GIOk, and GIOl.

The switches SWi, SWj, SWk and SWl connect to global IO lines GIOi, GIOj, GIOk, and GIOl, respectively. The activation of a bank selection signal BSi, BSj, BSk, or BSl enables a corresponding switch SWi, SWj, SWk or SWl. In response, the activated switch SWi, SWj, SWk or SWl connects a pair of global IO lines GIOi and GIOiB, GIOj and GIOjB, GIOk and GIOkB, or GIOl and GIOlB to a corresponding IO sense amplifying unit IOSAijkl. For example, switch SWi connects the global IO lines GIOi and GIOiB of the i-th bank to IO sense amplifying unit IOSAijkl in response to activation of the bank selection signal BSi. Similarly, switches SWj, SWk, and SWl respectively connect the global IO lines of the j-th, k-th, and l-th banks to the IO sense amplifying unit IOSAijkl in response to activation of the bank selection signals BSj, BSk, and BSl. As shown in FIG. 4, the switches SWi, SWj, SWk, and SWl can be realized with transfer gates TG1 through TG8, which are controlled by the bank selection signals BSi through BSl.

The IO sense amplifiers IOSA11 and IOSA22 of FIG. 3 connect a pair the global IO lines GIOi and GIOiB, GIOj and GIOjB, GIOk and GIOkB, or GIOl and GIOlB to the corresponding IO sense amplifying unit IOSAijkl when one of bank selection signals BSi through BSl selects a corresponding memory bank. For example, when the i-th memory bank is selected, the bank selection signal BSi is activated, enabling the switch SWi coupled to the global IO line GIOi. Accordingly, switch SWi connects the global IO line GIOi to the IO sense amplifying unit IOSAijkl. As a consequence, the IO sense amplifying unit IOSAijkl senses and amplifies the data bit transmitted on the global IO line GIOi in the i-th bank and transmits the data bit to corresponding data lines DIOijkl and DIOijklB.

According to the embodiment of FIGS. 3 and 4, four adjacent memory banks share an IO sense amplifier. Thus, when one of the first through fourth memory banks BANK1 through BANK4 is selected, the first IO sense amplifier IOSA11 selectively senses and amplifies data transmitted on one of the first through fourth global IO buses GIO1 through GIO4. Consequently, the memory requires fewer sense amplifiers and data buses. Thus, the number of data IO lines connected to the IO sense amplifiers is quartered, and the efficiency of the integrated circuit layout can be improved.

In the memory devices according to embodiments of the present invention described above, an IO sense amplifier is shared by at least two adjacent memory banks. Thus, the number of data IO lines as well as the number of IO sense amplifying units are reduced, so that the area of a chip becomes smaller.

The drawings and description disclose exemplary embodiments of the invention. These embodiments are used only to explain the present invention, not to restrict meanings or limit the scope of the present invention as set forth in the following claims. For example, the present specification discloses an example where two or four memory banks share an IO sense amplifier, but the number of memory banks that share one IO sense amplifier can be increased to more than four. Thus, the protected scope of the present invention must be determined by the attached claims.

What is claimed is:

1. A memory device comprising:

a plurality of memory banks;

a plurality of IO lines included respectively in the memory banks for transmitting data read from the memory banks; and a plurality of IO sense amplifiers, wherein each of the plurality of IO sense amplifiers is shared by four adjacent memory banks among the memory banks, for selectively sensing and amplifing data received from the IO lines.

2. The memory device as claimed in claim 1, wherein each of the memory banks has a corresponding row decoder and a corresponding column decoder, each column decoder being shared by at least two memory banks from among four memory banks sharing one IO sense amplifier.

3. The memory device as claimed in claim 1, wherein each of the IO sense amplifiers comprises:

a plurality of IO sense amplifying units; and a plurality of switches that connect IO lines in a selected memory bank to corresponding IO sense amplifying units in response to activation of a bank selection signal for the selected memory bank.

* * * * *